United States Patent
Sun

(10) Patent No.: US 6,694,468 B1
(45) Date of Patent: Feb. 17, 2004

(54) METHOD AND APPARATUS TO TEST MEMORY

(75) Inventor: Jiming Sun, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/516,321

(22) Filed: Mar. 1, 2000

(51) Int. Cl.$^7$ .............................................. G01R 31/28
(52) U.S. Cl. ...................................... 714/735; 714/718
(58) Field of Search ................................ 714/735, 718, 714/719; 711/3, 146, 113, 118, 143, 144

(56) References Cited

U.S. PATENT DOCUMENTS

| 4,167,779 | A | * | 9/1979 | Sullivan et al. |
| 6,240,532 | B1 | * | 5/2001 | Cho |
| 6,598,128 | B1 | * | 7/2003 | Yoshioka et al. ........... 711/144 |

* cited by examiner

*Primary Examiner*—Phung M. Chung
(74) *Attorney, Agent, or Firm*—Blakely, Sokoloff, Taylor & Zafman LLP

(57) ABSTRACT

A method includes filling a cache memory with a test pattern and forcing a write-back of the cache memory to a region of memory. The cache memory is refilled with the contents of the region of memory, and the contents of the cache memory are compared with the test pattern.

17 Claims, 4 Drawing Sheets

METHOD AND APPARATUS TO TEST MEMORY

BACKGROUND

1. Field

The invention relates to the testing of memory circuits.

2. Background Information

During the course of operation computer systems may perform procedures known as power on self test (POST) and boot. A computer system is any device comprising a processor and a memory to store instructions and data to be supplied to the processor. Typically, the processor and memory are coupled by way of one or more busses. Booting is typically accomplished by either powering on the computer system, or resetting the computer system to an initial state. A POST may then be performed to diagnose and initialize resources, such as random access memory (RAM), before transferring control to the computer system's basic input/output system (BIOS).

Diagnosing memory may be complicated by the presence of cache memories. A cache memory is any memory which operates to store a copy of the contents of a larger, slower memory. The operation and benefits of cache memories are well known in the art. During POST, data values may be read and written to memory. A pre-selected data pattern may be written to a memory region to test and then read back. The data pattern written is compared with the data pattern read to verify the read-write operation of the memory. When the memory cache is present and enabled, write operations to the memory may modify ranges of the cache memory, not the memory to which the write operation is addressed. Likewise, read operations from the memory may result in the reading of data from regions of cache memory and not from the memory regions addressed. Consequently, operation of the memory regions may not be properly validated during POST.

Prior art approaches to this problem have taken the approach of disabling cache memory before writing the test pattern to and reading it back from the memory region to test. However, the performance benefits associated with enabling cache memory are lost under these approaches.

SUMMARY

In one aspect, a method includes filling a cache memory with a test pattern and forcing a write-back of the cache memory to a region of memory. The cache memory is refilled with the contents of the region of memory, and the contents of the cache memory are compared with the test pattern.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

The embodiments described herein are merely illustrative, and one skilled in the art will appreciate that numerous modifications can be made which nonetheless fall within the scope of the present invention.

Figure 1:
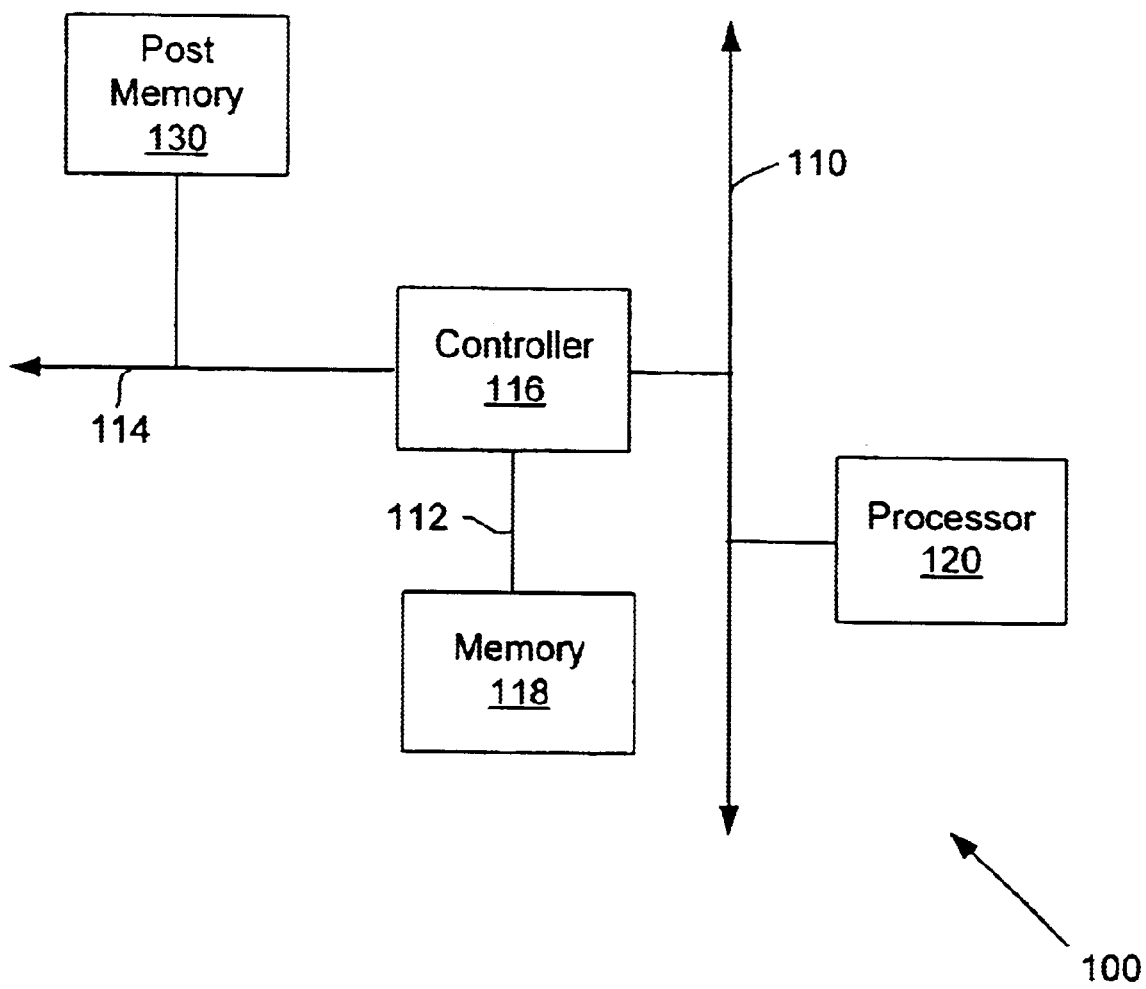
FIG. 1 is a block diagram of an embodiment of a system in accordance with the present invention.

FIG. 1 shows an embodiment 100 of a system in accordance with the present invention. Embodiment 100 comprises a processor 120 and a POST memory 130. Post memory 130 stores POST instructions and data, and may be a read-only memory, flash memory, or other type of memory. Processor 120 is coupled to a processor bus 110, which is also sometimes referred to as a "front side bus". A controller 116 is also coupled to bus 110 and provides for the routing and control of signals between processor 120 and memory 118. Memory 118 is coupled to controller 116 by memory bus 112. A bus 114 is also coupled to controller. Post memory 130 is coupled to bus 114. The controller 116 may rout signals from devices, such as post memory 130, coupled to bus 114 to and from memory 118 and to and from processor 120.

The processor 120 may be implemented using any semi-conductor fabrication technology and may execute any instruction set including, but not limited to, instruction sets supported by an Intel Corporation Pentium® processor or compatible processor. The busses may be implemented using technologies for propagating signals including, but not limited to, electronic and optical conductors. The memory 118 is typically some form of random access memory technology, of which many are well known in the art.

Figure 2:
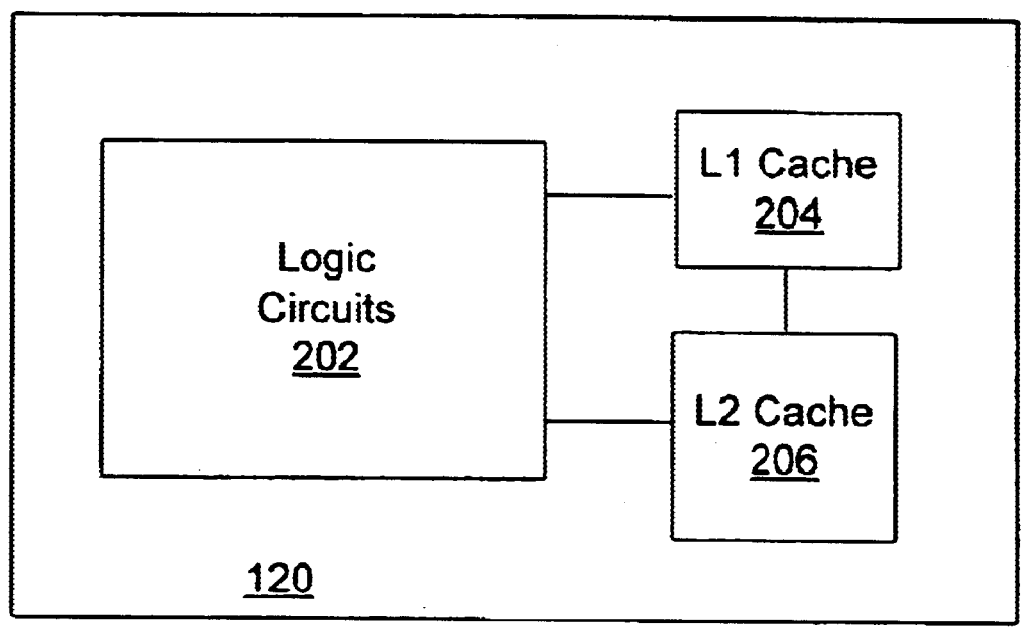
FIG. 2 is a block diagram of an embodiment of a processor in accordance with the present invention.

FIG. 2 shows an embodiment of processor 120 in accordance with the present invention. Processor 120 includes logic circuits 202 for executing instructions. Logic circuits 202 may comprise, for example, an arithmetic logic unit and a floating point unit. A level one (L1) cache 204 and a level two (L2) cache 206 are coupled to logic circuits 202 and provide caching of memory regions which are likely to be accessed during the course of instruction execution by logic circuits 202. In one embodiment L1 cache 204 is substantially smaller in terms of storage capacity than L2 cache 206. However L1 cache 204 will provide logic circuits 202 with faster access to instructions and data than will L2 cache 206.

L2 cache 206 may comprise a copy of the contents of memory 118 likely to be accessed by logic circuits 202 during the course of execution. L1 cache 204 may comprise a copy of the contents of memory 118 which are most likely to be accessed during the course of execution. The contents of the L1 cache 204 may comprise the portion of the contents of the L2 cache 206 that are most likely to be accessed in the course of execution.

Figure 3:
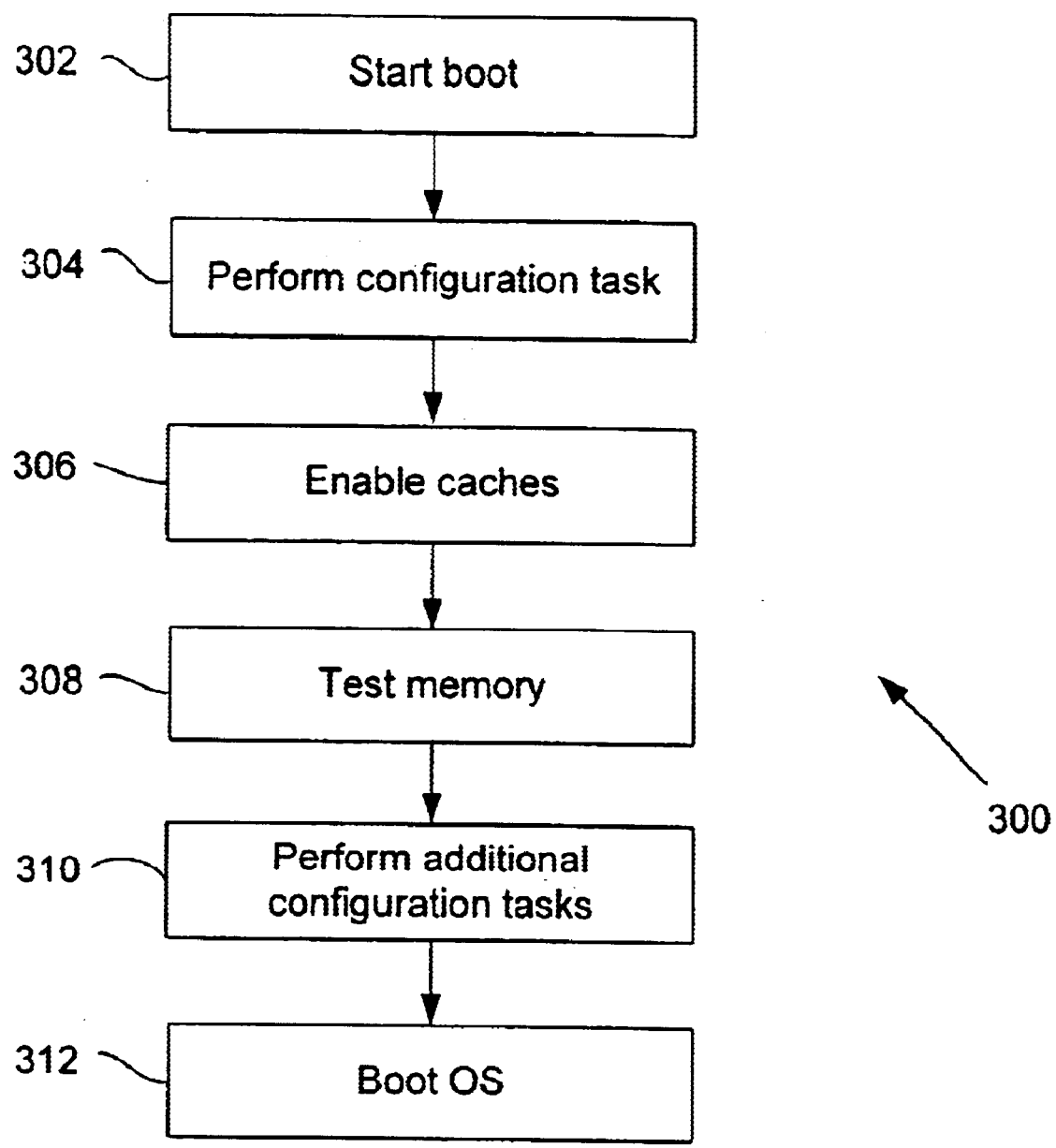
FIG. 3 is a flow chart of an embodiment of a method in accordance with the present invention.

FIG. 3 shows a method in accordance with the present invention. At 302 the process of booting a computer system starts. Initial configuration tasks are performed at 304. At 306 caching is enabled. Memory is tested at 308 with caching enabled. At 310 additional configuration tasks are performed. An operating system is booted at 312.

Advantages of caching are realized by enabling caching during the memory test. For example, it the memory test involves comparing the contents of memory with a test pattern, caching may substantially improve the speed the test because the contents of the memory may be cached during the comparison. Prior art approaches disabled caching during the memory test because caching interferes with the reading and writing of data patterns to the memory to test.

Figure 4:
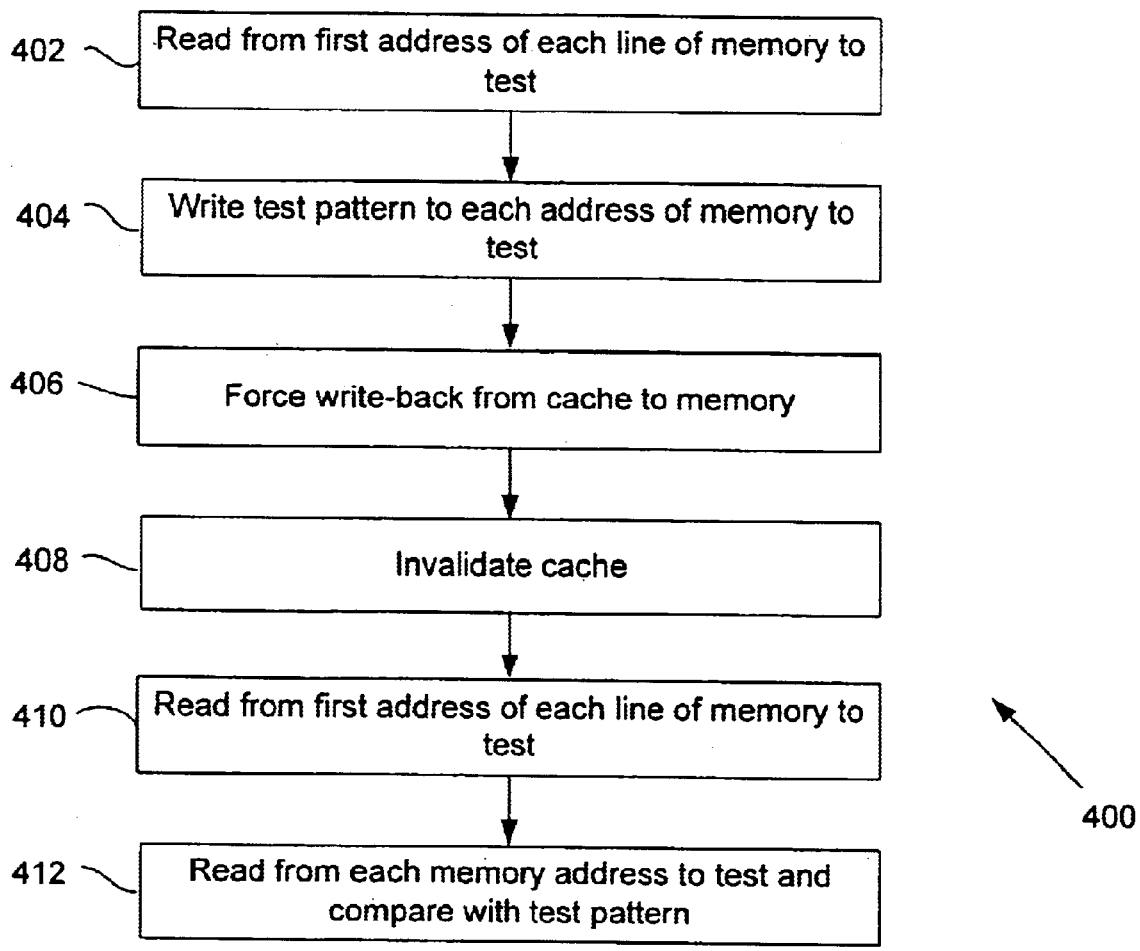
FIG. 4 is a flow chart of an embodiment of a method in accordance with the present invention.

FIG. 4 shows a memory test process in accordance with the present invention. At 402, the first address of each line of memory to test is read. A line of memory is a sequence of bytes the size of a cache line. A cache line is a number of bytes in the cache memory which may be read or written in a single bus cycle. In one embodiment, reading the first address of a line of memory to test with caching enabled copies the contents of the memory line to cache memory. An entire line of the memory, beginning at the address which is read, is loaded to the cache. Many conventional cache memories operate in this fashion.

The range of memory to test for a particular iteration of process 400 may be confined to the size of largest available cache, for example the size of the L2 cache. In this case the entire contents of the memory range to test for a particular iteration will fit into the cache memory. In addition, some range of the memory to test may be copied to the L1 cache (if L1 cache is present) according to the replacement algorithms employed by the caches.

At 404 a test pattern is written to each address of the memory to test. With caching enabled, the test pattern is actually written to the cache, not to the memory to test. At 406 a write-back from the cache to the memory is forced to occur. This causes the test pattern stored in the cache to be written to the range of memory to test. At 408 the cache is invalidated. When the cache is invalidated subsequent memory reads result in replacement of the contents of the cache. In some embodiments, execution of a single instruction by the processor may result in both the forced write-back and invalidation of the cache. For example, some processors manufactured by Intel Corporation may have an instruction WBINVD which operates in this manner.

At 410 the first address of each line of memory to test is read. In some embodiments, this will again result in the cache memory loading a copy of each line of the memory to test. If the memory is operating properly the contents will include the test pattern which was written to the memory as a result of the write-back from the cache. At 412 each memory address is compared with the test pattern. With caching enabled, this comparison is carried out on the contents of cache memory, resulting in a performance improvement. If the contents match the test pattern, memory operation is verified. If the pattern does not match the test pattern, this might be an indication that memory is not operating properly. In one embodiment, the cache memory itself is tested independently before executing method embodiment 400. Therefore deviations detected in a test pattern 412 by method 400 indicate a defect in the operation of memory 118, not cache memory.

While certain features of the invention have been illustrated as described herein, many modifications, substitutions, changes and equivalents will now occur to those skilled in the art. It is, therefore, to be understood that the appended claims are intended to cover all such embodiments and changes as fall within the true spirit of the invention.

What is claimed is:

1. A method comprising:
   filling a cache memory with a test pattern;
   forcing a write-back of the cache memory to a region of random-access memory other than cache memory (non-cache memory);
   refilling the cache memory with the contents of the region of non-cache memory; and
   comparing the contents of the cache memory with the test pattern.

2. The method of claim 1 in which refilling the cache memory further comprises:
   invalidating the contents of the cache; and
   reading the contents of the region of non-cache memory.

3. The method of claim 2 in which reading the contents of the region of non-cache memory further comprises:
   reading the first byte of each range of the region of non-cache memory that will fit in a cache line.

4. The method of claim 1 in which filling the cache memory further comprises:
   reading the contents of the region of non-cache memory.

5. The method of claim 4 in which reading the contents of the region of non-cache memory further comprises:
   reading the first byte of each range of the region of non-cache memory that will fit in a cache line.

6. A method comprising:
   during power-on self test of a computer system, writing a data pattern to a random access memory region other than cache memory (non-cache memory) with caching enabled;
   exchanging the data pattern between the non-cache memory region and a cache memory; and
   comparing the contents of the cache memory with the data pattern.

7. The method of claim 6 in which exchanging the data pattern further comprises:
   forcing a write-back from the cache memory;
   invalidating the contents of the cache memory; and
   reading from addresses in the non-cache memory region.

8. An apparatus comprising:
   a processor;
   a random access memory other than cache memory (non-cache memory);
   a second memory coupled to the processor by way of a bus, the second memory storing instructions which, when executed by the processor, result in filling a cache memory with a test pattern;
   forcing a write-back of the cache memory to a region of the non-cache memory;
   refilling the cache memory with the contents of the region of the non-cache memory; and
   comparing the contents of the cache memory with the test pattern.

9. The apparatus of claim 8 in which the instructions, when executed by the processor to refill the cache memory, further result in:
   invalidating the contents of the cache; and
   reading the contents of the region of the non-cache memory.

10. The apparatus of claim 8 in which the instructions, when executed by the processor to read the contents of the region of the non-cache memory, further result in:
    reading the first byte of each range of the region of the non-cache memory that will fit in a cache line.

11. The apparatus of claim 8 in which the instructions, when executed by the processor to fill the cache memory, further result in:
    reading the contents of the region of the non-cache memory.

12. The apparatus of claim 11 in which the instructions, when executed by the processor to read the contents of the region of the non-cache memory, further result in:
    reading the first byte of each range of the region of memory that will fit in a cache line.

13. An article comprising:
a random access memory other than cache memory (non-cache memory) capable of providing instructions for execution by a processor, the non-cache memory comprising instructions which, when executed by the processor, result in
filling a cache memory with a test pattern;
forcing a write-back of the cache memory to a region of a second memory;
refilling the cache memory with the contents of the region of the second memory; and
comparing the contents of the cache memory with the test pattern.

14. The article of claim 13 in which the instructions, when executed by the processor to refill the cache memory, further result in:
invalidating the contents of the cache; and
reading the contents of the region of the second memory.

15. The article of claim 13 in which the instructions, when executed by the processor to read the contents of the region of the second memory, further result in:
reading the first byte of each range of the region of the non-cache memory that will fit in a cache line.

16. The article of claim 13 in which the instructions, when executed by the processor to fill the cache memory, further result in:
reading the contents of the region of the non-cache memory.

17. The article of claim 16 in which the instructions, when executed by the processor to read the contents of the region of the non-cache memory, further result in:
reading the first byte of each range of the region of memory that will fit in a cache line.

* * * * *